United States Patent [19]

Oba et al.

[11] 3,884,703

[45] May 20, 1975

[54] BISAZIDE SENSITIZED PHOTORESISTOR COMPOSITION WITH DIACETONE ACRYLAMIDE

[75] Inventors: Yoichi Oba, Hachioji; Teruo Tsunoda, Tokyo, both of Japan

[73] Assignee: Hitachi, Ltd., Japan

[22] Filed: Apr. 11, 1973

[21] Appl. No.: 350,012

[30] Foreign Application Priority Data

Apr. 17, 1972 Japan ............................... 47-37702

[52] U.S. Cl. ..................... 96/115 R; 96/35.1; 96/36; 96/36.1; 96/36.2; 96/75; 96/86 P; 96/91 N; 204/159.15; 204/159.16

[51] Int. Cl. .......................... G03c 1/52; G03c 1/72

[58] Field of Search ...... 96/91 N, 75, 115 R, 115 P, 96/35.1; 204/159.15, 159.16; 260/349

[56] References Cited

UNITED STATES PATENTS

| | | | |
|---|---|---|---|
| 2,687,958 | 8/1954 | Neugebauer | 96/91 N |
| 2,692,826 | 10/1954 | Neugebauer et al. | 96/91 N |
| 3,002,003 | 9/1961 | Merrill et al. | 96/91 N |
| 3,143,417 | 8/1964 | Reichel et al. | 96/91 N |
| 3,278,305 | 10/1966 | Laridon et al. | 96/91 N |
| 3,475,176 | 10/1969 | Rauner | 96/91 N |
| 3,615,538 | 10/1971 | Peters et al. | 96/91 N |
| 3,616,370 | 10/1971 | Jennings | 204/159.15 |
| 3,617,278 | 11/1971 | Holstead et al. | 96/91 N |
| 3,715,210 | 2/1963 | Watkinson et al. | 96/91 N |
| 3,721,566 | 3/1973 | Laridon et al. | 96/91 N |
| 3,725,231 | 4/1973 | Jahnke | 96/115 P |
| 3,737,319 | 6/1973 | Borden | 96/115 R |
| 3,794,494 | 2/1974 | Kai et al. | 96/115 P |
| 3,816,559 | 6/1974 | Farone | 204/159.17 |

*Primary Examiner*—Charles L. Bowers, Jr.
*Attorney, Agent, or Firm*—Craig & Antonelli

[57] ABSTRACT

When the diacetone acrylamide is added to the photoresist composition which comprises a water soluble organic resin and a bisazide, the photoresist composition thus obtained has an excellent adhesion force for a substrate.

4 Claims, No Drawings

BISAZIDE SENSITIZED PHOTORESISTOR COMPOSITION WITH DIACETONE ACRYLAMIDE

BACKGROUND OF THE INVENTION

This invention relates to a photoresist composition comprising a water soluble organic resin and a photochemical cross-linking reaction initiator consisting of an organic compound and more particularly the photoresist composition containing diacetone acrylamide, whereby when the photoresist composition is coated on a substrate to form a photoresist film, this film adheres strongly on the substrate.

Conventionally, photoresists have been widely used for photo-engraving or for photoetching in printing or in production of semiconductor devices, microelectronic circuit, face plates of color picture tube, etc. and for these purpose they are required to have the following properties.

1. They have an excellent resolution.
2. They have good preservability.
3. The hardened photoresists have a high toughness, corrosion resistance and wear resistance.
4. They have sufficient adhesion force to a substrate and provide a high developing latitude.
5. The photoresists and developer used cause no public pollutions.

Conventionally, as water soluble photoresists for these purposes, bichromate photoresists which comprises a water soluble organic resin such as glue, gelatine, albumen, polyvinyl alcohol, etc. and a bichromate as a photochemical cross-linking reaction initiator have been widely used because such photoresists are inexpensive and substantially meet the above requirements (1), (3) and (4). However, said photoresists have the defects that they are gradually modified due to a spontaneous reaction called the dark reaction to become unusable and that public pollution with chromium is caused by bichromates used as a photochemical reaction initiator.

For removal of those defects, it has been attempted to introduce photoresistive group into the water soluble organic resins or to mix organic photosensitive material and organic resins.

As one of these attempts, production of photoresists by mixing a photochemical cross-linking reaction initiator which consists of organic compound in place of bichromates with a water soluble organic resin has been proposed.

One example thereof is a photoresist composition which comprises a water soluble bisazide compound having hydrophilic group such as sodium 4,4'-diazidestilbene-2,2'-disulfonate and a water soluble organic resin such as polyacrylamide, polyvinyl alcohol, gelatine, etc.

According to these bisazide photoresists, those which have various properties depending upon the properties of the organic resins to be used can be obtained and they nearly satisfy said requirements (1), (2) and (5). However, these photoresists generally have low adhesion force to substrate and when hardened, a part or whole of the photoresists peels from the substrate under too strong developing conditions and when the developing conditions are too weak, non-hardened portions remain and sufficient resolution is not provided. In general, bisazide photoresists are inferior in adhesion force to substrate to bichromate photoresists. The reason therefor is not clear, but it seems that in the latter, chromium ion has an action of bonding the substrate and the organic resin while in the former, there is no such action.

SUMMARY OF THE INVENTION

The purpose of this invention is to provide bisazide photoresists having excellent adhesion force to a substrate and having no defects as seen in the conventional bisazide photoresists.

For attaining the above purpose, according to this invention, to a mixture system of a water soluble organic resin and a bisazide as photochemical cross-linking reaction initiator was added diacetone acrylamide which is a water soluble monomer in an amount of at least 5 parts by weight per 100 parts by weight of said water soluble organic resin. Upper limit of amount of the diacetone acrylamide is determined depending on viscosity of the aqueous solution of the photoresist, uniformity of film formed and compatibility with the water soluble organic resins and may be used within such an amount as satisfying said requirements. However, the upper limit is practically about 200 parts by weight.

Diacetone acrylamide has a high solubility in water, namely, more than 100 parts by weight of the diacetone acrylamide may be dissolved in 100 parts by weight of water at 25°C and it is polymerized under the irradiation of the ultraviolet rays to become a water insoluble polymer having a high adhesion force to a substrate. Therefore, when diacetone acrylamide is present in a water soluble photoresist, the adhesion force between the hardened photoresist and a substrate is improved.

Diacetone acrylamide which has the following structure formula is also called N[2-(2-methyl-4-oxopentyl)] acrylamide.

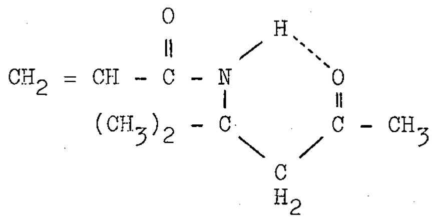

Photoresists which can be improved in adhesion force to a substrate by addition of diacetone acrylamide comprise a mixture of a water soluble organic resin and a bisazide compound is a photochemical reaction initiator. Examples of the known bisazide compounds are as follows:

Sodium 4,4'-diazidestilbene-2,2'-disulfonate;
Sodium 4,4'-diazidestilbene-γ-carboxylate;
Sodium 4,4'-diazidebenzalacetophenone-2-sulfonate; etc.

Examples of the known water soluble organic resins are as follows:

Polyvinylpyrrolidone; polyacrylamide; gelatine; water soluble polyacrylates such as sodium salt; methyl cellulose; poly-L-glutamate water soluble salts such as sodium salts, ammonium salts, etc.; copolymers of vinyl alcohol and maleic acid; copolymers of vinyl alcohol and acrylamide; etc.

Blending ratio of these known water soluble organic resins and bisazide varies depending on the kind of raw materials and so cannot be shown by a range of specific numerical values. Any known photoresists in which a bisazide is used in place of bichromate as a photochemical reaction initiator can be used in this invention.

DESCRIPTION OF THE PREFERRED EMBODIMENTS

This invention will be illustrated by the following Examples.

Example 1

A photoresist solution was prepared by dissolving 1.5 part by weight of polyacrylamide (Olefloc NP-1: manufactured by Organo K.K.) and 0.03 part by weight of sodium 4,4'-diazidestilbene-2,2'-disulfonate in 100 parts by weight of water. The resultant photoresist solution was divided into four parts. To each of the four solutions was added 0, 0.15, 0.30 and 1.5 parts by weight of diacetone acrylamide, respectively, to obtain four kinds of photoresist solutions. Each of them was uniformly coated on glass substrates (50 × 50 mm) and dried to form films of about 1 μ in thickness. Thereafter, a mask which has holes of 0.35 mm in diameter two-dimensionally disposed at a pitch of 0.6 mm was put on each film. These films were exposed through the holes of the mask at 800 lux for 4 minutes with an ultra-high pressure mercury lamp and developed with water spray (water pressure 0.5 kg/cm²) for 30 seconds and with flowing water for 3 minutes. For comparison of adhesion force of the hardened photoresists, from a nozzle of 1 mm in diameter a flowing water having a water pressure of 40 mmHg was vertically thrown on the surface of each film which is 160 mm away from the nozzle for 2 minutes and peeling of dots of the hardened photoresist was examined. The results are shown in Table 1. In Table 1, the first column shows the amount (part by weight) of added diacetone acrylamide per 100 parts by weight of water soluble organic resin (polyacrylamide), the second column shows the number of the hardened photoresist dots removed by water stream from nozzle and the third column shows the proportion in percentage of the number of the removed dots when diacetone acrylamide was contained to that of the removed dots when no diacetone acrylamide was contained. It is clear from those results that diacetone acrylamide has an effect of improving adhesion force.

Table 1

| Amount of diacetone acrylamide added | Number of the removed dots | Proportion of number of the removed dots |
|---|---|---|
| 0 | 26 | 100 % |
| 10 | 21 | 81 % |
| 20 | 10 | 38 % |
| 100 | 0 | 0 % |

Example 2

A photoresist solution was prepared by dissolving 5 parts by weight of polyvinyl pyrrolidone K-90 (Trade name by BASF Co.) and 1 part by weight of sodium 4,4'-diazidestilbene-2,2'-disulfonate in 100 parts by weight of water. The resultant solution was divided into six parts. To each of these six photoresist solutions was added diacetone acrylamide in an amount of 0, 0.25, 0.5, 2.5, 5 and 10 parts by weight, respectively to obtain six photoresist solutions. Each of them was coated on glass substrate to obtain a film of about 1 μ in thickness, which was dried and exposed as in Example 1 except that the exposure was effected at 3600 lux for 1 minute. Then, these were developed with flowing water for 3 minutes and the adhesion force of the films to the substrate was evaluated in the same manner as in Example 1. The results are shown in Table 2 in the same manner as in Table 1. In Table 2, amount (part by weight) of the added diacetone acrylamide is shown in terms of the amount thereof per 100 parts by weight of polyvinylpyrrolidone. It is clear from these results that diacetone acrylamide has an effect of improving the adhesion force of the photoresist film to substrate.

Table 2

| Amount of diacetone acrylamide added | Number of the removed dots | Proportion of removed dots |
|---|---|---|
| 0 | 120 | 100 % |
| 5 | 72 | 60 % |
| 10 | 50 | 42 % |
| 50 | 17 | 14 % |
| 100 | 12 | 10 % |
| 200 | 10 | 8 % |

The above Examples illustrate one representative embodiment of this invention. The water soluble organic resins and bisazides are not limited to only the polyacrylamide and polyvinylpyrrolidone and sodium 4,4'-diazidestilbene-2,2'-disulfonate, respectively and any photoresist compositions containing water soluble organic resins and bisazides having the known composition can be used with the same results as those obtained in the above Examples.

As explained above, according to this invention, the adhesion force between substrate and hardened photoresist can be conspicuously increased by adding diacetone acrylamide to the conventional photoresist composition comprising a bisazide as a photochemical reaction initiator and a water soluble organic resin.

Therefore, the photoresist composition of this invention can be used, for example, in production of microelectronic circuit, face plate of color picture tube, etc. with extremely excellent results and an etching treatment with high accuracy.

What we claim is:

1. A photoresist composition comprising a water soluble organic resin selected from the group consisting of polyacrylamide, polyvinylpyrrolidone, gelatin, methylcellulose, a water soluble salt of poly-L-glutamate, a water soluble polyacrylate, a copolymer of vinyl alcohol and maleic acid, and a copolymer of vinyl alcohol and acrylamide, and a bisazide selected from the group consisting of sodium-4,4'-diazidestilbene-2,2'-disulfonate, sodium-4,4'-diazidestilbene-γ-carboxylate and sodium-4,4'-diazidebenzalacetophenone-2-sulfonate, as a photochemical reaction initiator, characterized in that diacetone acrylamide is added therein in an amount of at least 5 parts by weight based on 100 parts of said water soluble resin, whereby said photoresist composition is remarkably improved in adhesion for a substrate.

2. The photoresist composition according to claim 1, in which the amount of diacetone acrylamide is the range of 50 to 200 parts.

3. A photoresist composition consisting essentially of an aqueous solution containing polyacrylamide and sodium-4,4′-diazidestilbene-2,2′-disulfonate, characterized in that in said aqueous solution is dissolved diacetone acrylamide of an amount of 10 to 100 parts by weight based on 100 parts of polyacrylamide.

4. A photoresist composition consisting essentially of an aqueous solution containing polyvinylpyrrolidene and sodium-4,4′-diazidestilbene-2,2′-disulfonate, characterized in that in said aqueous solution is dissolved diacetone acrylamide in an amount of 5 to 200 parts by weight based on 100 parts of polyvinylpyrolidone.

* * * * *